US009084348B2

United States Patent
Murase et al.

(10) Patent No.: US 9,084,348 B2
(45) Date of Patent: Jul. 14, 2015

(54) HIGH-FREQUENCY MODULE

(75) Inventors: Hisanori Murase, Nagaokakyo (JP); Takanori Uejima, Nagaokakyo (JP)

(73) Assignee: Murata Manufacturing Co., Ltd., Kyoto (JP)

(*) Notice: Subject to any disclaimer, the term of this patent is extended or adjusted under 35 U.S.C. 154(b) by 588 days.

(21) Appl. No.: 12/960,581

(22) Filed: Dec. 6, 2010

(65) Prior Publication Data

US 2011/0133850 A1  Jun. 9, 2011

(30) Foreign Application Priority Data

Dec. 7, 2009 (JP) .................................. 2009-277133

(51) Int. Cl.
*H05K 1/02* (2006.01)
*H01L 21/48* (2006.01)
*H01L 23/00* (2006.01)

(52) U.S. Cl.
CPC .......... *H05K 1/0228* (2013.01); *H01L 21/4857* (2013.01); *H01L 24/29* (2013.01); *H01L 24/30* (2013.01); *H01L 24/83* (2013.01); *H01L 2224/48091* (2013.01); *H05K 1/0243* (2013.01); *H05K 2201/10053* (2013.01)

(58) Field of Classification Search
CPC ..... H01L 24/83; H01L 21/4857; H01L 24/29; H01L 24/30; H01L 2224/48091; H05K 1/0228; H05K 1/0243; H05K 2201/10053
USPC .......... 361/772, 760, 764; 174/250, 260, 261, 174/262; 333/128, 101
See application file for complete search history.

(56) References Cited

U.S. PATENT DOCUMENTS

| | | | | |
|---|---|---|---|---|
| 4,680,675 A * | 7/1987 | Sato | ................. | 361/748 |
| 7,599,190 B2 * | 10/2009 | Okubora | ................. | 361/760 |
| 7,649,499 B2 * | 1/2010 | Watanabe | ............. | 343/700 MS |
| 7,948,078 B2 * | 5/2011 | Hiraga | ................. | 257/724 |
| 8,089,149 B2 * | 1/2012 | Hiraga | ................. | 257/734 |
| 2002/0084522 A1 * | 7/2002 | Yoshizawa et al. | ........... | 257/692 |
| 2002/0172026 A1 * | 11/2002 | Chong et al. | ................. | 361/777 |
| 2006/0103485 A1 * | 5/2006 | Okuyama et al. | ............. | 333/132 |
| 2006/0137905 A1 * | 6/2006 | Kariya et al. | ................. | 174/255 |
| 2006/0231290 A1 * | 10/2006 | Kariya et al. | ................. | 174/258 |

(Continued)

FOREIGN PATENT DOCUMENTS

| | | |
|---|---|---|
| CN | 1788531 A | 6/2006 |
| JP | 60-97653 A | 5/1985 |

(Continued)

OTHER PUBLICATIONS

Official Communication issued in corresponding Japanese Patent Application No. 2009-277133, mailed on Jan. 17, 2012.

*Primary Examiner* — Adrian S Wilson
*Assistant Examiner* — Abhishek Rathod
(74) *Attorney, Agent, or Firm* — Keating & Bennett, LLP

(57) ABSTRACT

A high frequency module includes RF terminal lands at a first layer that is a surface layer of a multilayer substrate on which RF terminal electrodes of a switch IC are mounted that are arranged in a line. Each of the RF terminal lands is electrically connected to one end of a lead electrode at a second layer via a via hole. Some of the lead electrodes extend from corresponding ones of the RF terminal lands in an outward direction away from a side of the switch IC. The remaining ones of the lead electrodes extend from corresponding ones of the RF terminal lands in an inward direction that is opposite to the outward direction.

3 Claims, 8 Drawing Sheets

(56) References Cited

U.S. PATENT DOCUMENTS

| | | | |
|---|---|---|---|
| 2007/0030095 A1* | 2/2007 | Hikita et al. | 333/133 |
| 2007/0035362 A1* | 2/2007 | Uejima et al. | 333/133 |
| 2007/0107933 A1 | 5/2007 | Yamamoto et al. | |
| 2008/0191956 A1* | 8/2008 | Watanabe | 343/841 |
| 2008/0229822 A1* | 9/2008 | Kato | 73/504.12 |
| 2008/0231387 A1* | 9/2008 | Nagai | 333/5 |
| 2008/0272854 A1* | 11/2008 | Hikita et al. | 333/133 |
| 2008/0315968 A1* | 12/2008 | Uejima et al. | 333/4 |

FOREIGN PATENT DOCUMENTS

| | | |
|---|---|---|
| JP | 60-226196 A | 11/1985 |
| JP | 8-21668 B2 | 3/1996 |
| JP | 2002-118146 A | 4/2002 |
| JP | 2004-282727 A | 10/2004 |
| JP | 2006-195315 A | 7/2006 |
| JP | 2007-096246 A | 4/2007 |
| WO | 2005/098359 A1 | 10/2005 |

* cited by examiner

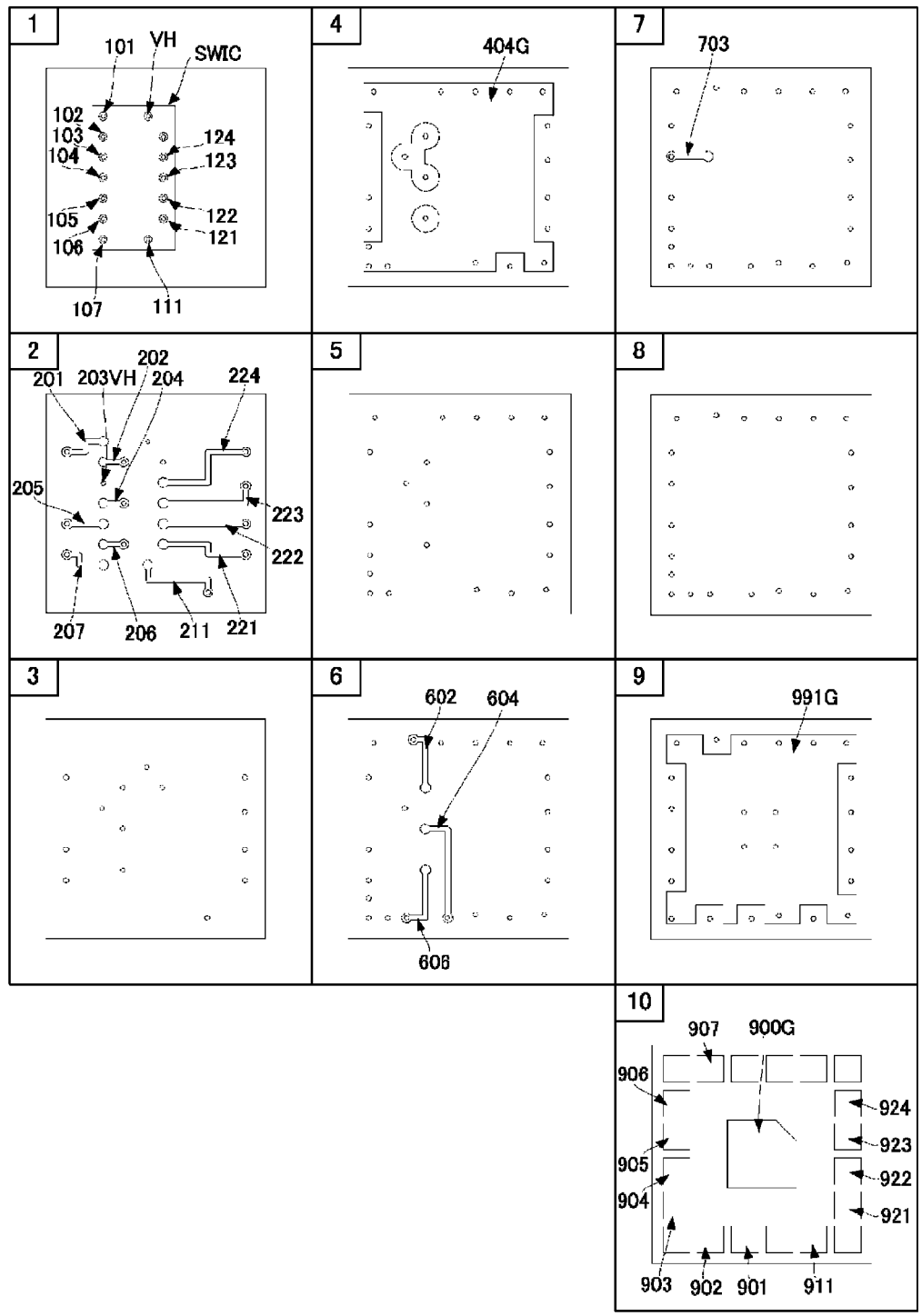

HIGH-FREQUENCY MODULE

BACKGROUND OF THE INVENTION

1. Field of the Invention

The present invention relates to a high-frequency module in which a circuit element, such as a switch IC including a plurality of terminal electrodes, is mounted on a multilayer substrate.

2. Description of the Related Art

With the increase in sophistication and functionality of communication modules, such as mobile telephones, the need to transmit/receive communication signals in different frequency bands with a single antenna has arisen. In response to this need, various high-frequency modules each of which includes a switch IC have been proposed.

In a high-frequency module disclosed in Japanese Unexamined Patent Application Publication No. 2004-282727, a switch IC is mounted on a multilayer substrate so as to define a mounting component. Various circuits connected to terminals of the switch IC are disposed in the multilayer substrate. These circuits are defined by electrode patterns on and in the multilayer substrate and a mounting component.

The switch IC includes an antenna common terminal and a plurality of RF terminals, and is arranged to switch among the RF terminals to be connected to the antenna common terminal. Terminal electrodes defining the terminals of the switch IC are provided along sides of the switch IC chip.

As disclosed in Japanese Unexamined Patent Application Publication No. 2004-282727, lands are provided on the multilayer substrate at locations corresponding to the locations of the terminal electrodes of the switch IC. A line pattern extending from each of the lands is provided on the multilayer substrate.

The line pattern connected to each of the lands extends from the land in a direction away from the switch IC.

However, in the high-frequency module disclosed in Japanese Unexamined Patent Application Publication No. 2004-282727, the following problem arises. FIG. 8 is a diagram illustrating a problem that arises when lead line patterns in the related art are used.

As illustrated in FIG. 8, RF terminal lands 101 to 105 for a switch IC (SWIC) are arranged on a multilayer substrate at regular intervals along a side of the switch IC. Lead electrodes 201P to 205P extend from the RF terminal lands 101 to 105, respectively. The lead electrodes 201P to 205P include a portion arranged to extend in a direction away from the side of the switch IC (an oval region represented by a broken line in FIG. 8.) In this region, the lead electrodes 201P to 205P are parallel to one another. The intervals at which the lead electrodes 201P to 205P are arranged are equal to the intervals at which the RF terminal lands 101 to 105, that is, the terminal electrodes of the switch IC, are arranged.

When a signal is transmitted through one of the lead electrodes, a magnetic field is generated around the lead electrode and is coupled to another one of the lead electrodes adjacent to the lead electrode. That is, the isolation between these lead electrodes is deteriorated. In particular, in currently available small-sized high-frequency modules, the size of a switch IC is also relatively small. Accordingly, the intervals at which lands for the switch IC are arranged are relatively short, that is, a lead electrode formation pitch is relatively small. This deteriorates the isolation between lead electrodes.

SUMMARY OF THE INVENTION

To overcome the problems described above, preferred embodiments of the present invention provide a small-sized high-frequency module capable of obtaining a sufficient isolation between terminals.

A high-frequency module according to a preferred embodiment of the present invention includes a switch IC and a multilayer substrate on which the switch IC is mounted. The switch IC includes a plurality of connection terminals arranged in a predetermined direction. The multilayer substrate includes a plurality of lands and a plurality of lead electrodes. The plurality of lands are arranged on a mounting surface on which the switch IC is to be mounted so that they are connected to the plurality of predetermined connection terminals. The plurality of lead electrodes extend from the plurality of lands. Ones of the plurality of lead electrodes that are connected to adjacent ones of the plurality of lands in a land arrangement direction are arranged so that portions of the lead electrodes at a predetermined distance from the lands extend in different directions from the lands.

In the above-described configuration, lead electrodes connected to adjacent lands for a switch IC are preferably arranged at the same or substantially the same interval as that at which the lands are arranged, but are not parallel to each other. As a result, the isolation between these lead electrodes is improved.

In the high-frequency module according to a preferred embodiment of the present invention, ones of the plurality of lead electrodes that are connected to adjacent ones of the plurality of lands in the land arrangement direction preferably extend in opposite directions with respect to the land arrangement direction.

Thus, by arranging lead electrodes connected to adjacent lands so that they extend in opposite directions, as will be described later with reference to FIGS. 1 and 2, it is possible to arrange portions of lead electrodes at a predetermined distance from corresponding lands, for example, portions of RF lead electrodes 201 and 203, at an interval equal or substantially equal to a result of addition of two land intervals. As a result, the isolation between these lead electrodes is improved.

In the high-frequency module according to a preferred embodiment of the present invention, ones of the plurality of lead electrodes that are connected to ones of the plurality of lands at both ends in the land arrangement direction are preferably arranged so that portions of the lead electrodes at a predetermined distance from the lands extend in directions that are parallel or substantially parallel to the land arrangement direction and are spaced away from a group of the plurality of lands.

Thus, by arranging lead electrodes at both ends so that they extend in directions away from the group of lands, there is no lead electrode that is adjacent to and parallel or substantially parallel to each of these lead electrodes. The isolation of each of these lead electrodes from another lead electrode is significantly improved. In addition, by providing such a lead electrode structure, the number of lead electrodes extending from a land in a direction perpendicular or substantially perpendicular to a land arrangement direction is reduced. That is, the number of lead electrodes that is parallel to another lead electrode is reduced.

In the high-frequency module according to a preferred embodiment of the present invention, the plurality of lands are preferably alternately arranged on first and second axes along the land arrangement direction in a staggered pattern. Ones of the plurality of lead electrodes that are connected to ones of the plurality of lands on the first axis preferably extend from the lands in a direction opposite to the second axis. Ones of the plurality of lead electrodes that are connected to ones of the plurality of lands on the second axis preferably extend from the lands in a direction opposite to the first axis.

By arranging lead electrodes that are connected to lands on a first axis so that they extend in a direction away from a second axis and arranging lead electrodes that are connected to lands on the second axis so that they extend in a direction away from the first axis, it is possible to obtain the same effect as that obtained in the above-described case in which lead electrodes connected to adjacent lands arranged in line extend in opposite directions.

In the high-frequency module according to a preferred embodiment of the present invention, ones of the plurality of lead electrodes that are connected to adjacent ones of the plurality of lands in the land arrangement direction are preferably disposed at different layers of the multilayer substrate.

Thus, by disposing lead electrodes at a plurality of layers, the isolation between lead electrodes disposed at different layers is improved.

In the high-frequency module according to a preferred embodiment of the present invention, frequency bands of signals transmitted to adjacent ones of the plurality of lands and adjacent ones of the plurality of lead electrodes preferably partially overlap each other.

When frequency bands partially overlap, the coupling between lead electrodes causes a problem. Accordingly, with the above-described configuration according to a preferred embodiment of the present invention, the coupling problem is effectively prevented.

In the high-frequency module according to a preferred embodiment of the present invention, the switch IC preferably includes a plurality of driving signal input terminals in addition to a plurality of predetermined terminal electrodes that are RF terminals arranged to transmit/receive a high-frequency signal. The multilayer substrate preferably includes a plurality of driving signal lands that are connected to the plurality of driving signal input terminals and a plurality of driving signal lead electrodes that individually extend from the plurality of driving signal lands in a direction away from the plurality of predetermined terminal electrodes that are RF terminals.

In order to cause a switch IC to perform a switching operation, a driving signal is needed for the switch IC. Accordingly, the switch IC preferably includes a driving signal input terminal arranged to receive a driving signal, and a multilayer substrate includes a driving signal land and a driving signal lead electrode which are used to transmit a driving signal to the driving signal input terminal. By arranging the driving signal lead electrode so as to be spaced apart from a group of RF terminals, the isolation between the driving signal lead electrode and each of the RF terminals and lead electrodes connected to the RF terminals is improved.

According to a preferred embodiment of the present invention, even if a small-sized switch IC is provided, the distance between parallel lead electrodes can be increased. This improves the isolation between these lead electrodes. Accordingly, a signal is effective prevented from entering a nontarget terminal electrode of the switch IC via a lead electrode. Therefore, the occurrence of defects in a switching characteristic and a transmission characteristic of the switch IC, for example, a switching operation malfunction and entering of noise, is effectively prevented.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 6 is a lamination diagram of a high-frequency module according to a fifth preferred embodiment of the present invention.

DETAILED DESCRIPTION OF THE PREFERRED EMBODIMENTS

Figure 1:
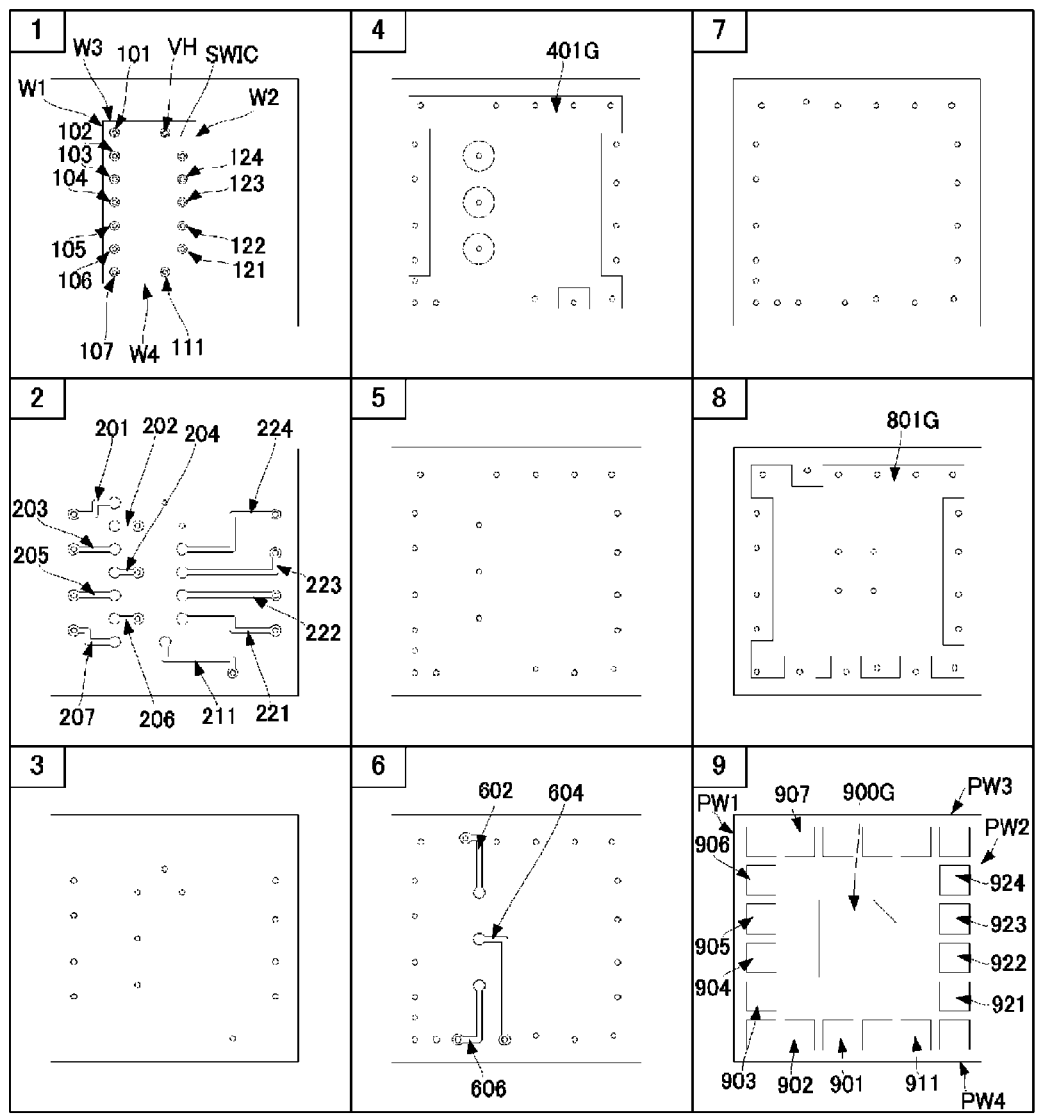
FIG. 1 is a lamination diagram of a high-frequency module according to a first preferred embodiment of the present invention.
Figure 2:
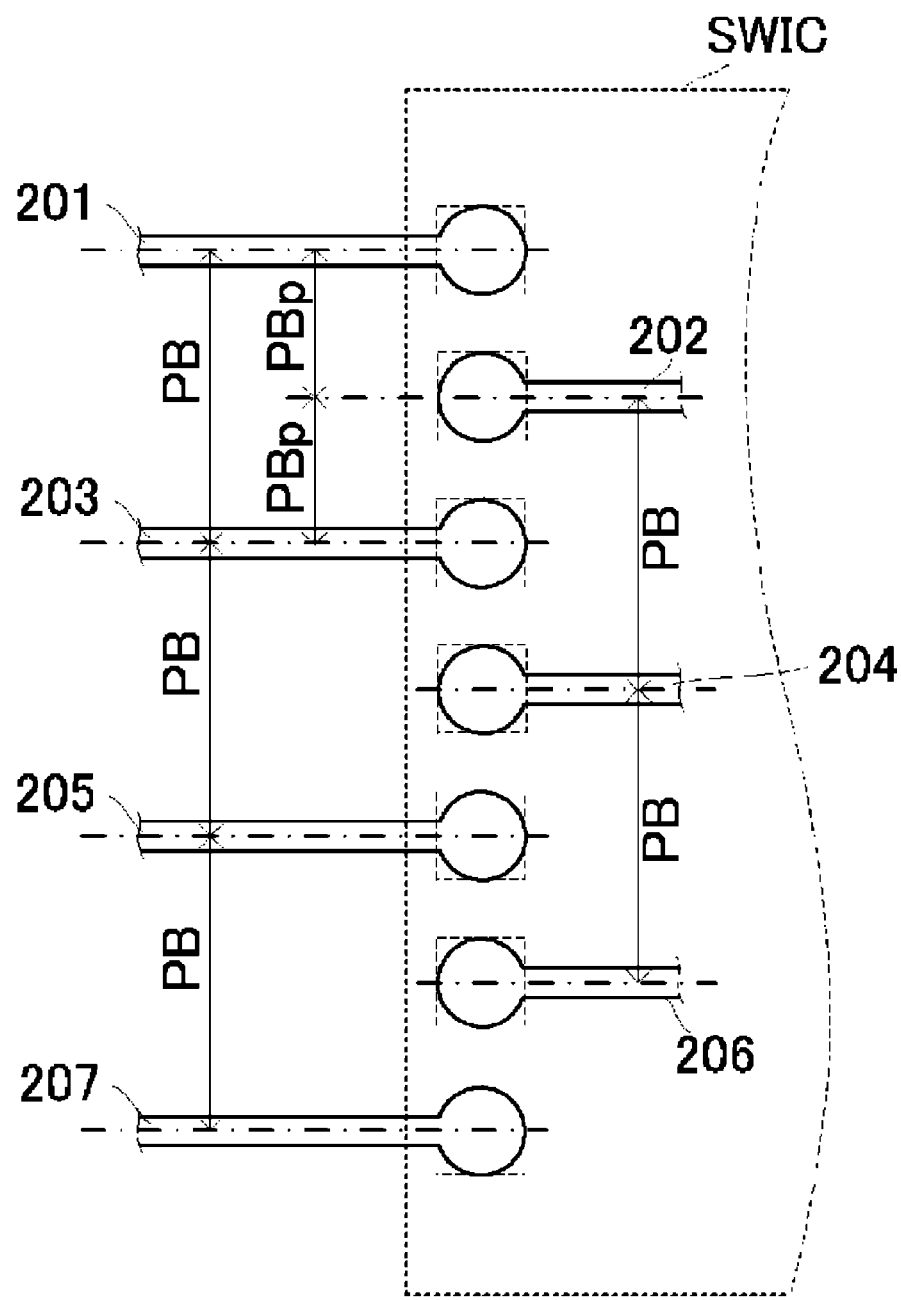
FIG. 2 is an enlarged plan view of a second layer showing the configuration of lead electrodes for a switch IC (SWIC) in a high-frequency module according to the first preferred embodiment of the present invention.

A high-frequency module according to a first preferred embodiment of the present invention will be described with reference to the accompanying drawings. FIG. 1 is a lamination diagram of a high-frequency module according to the first preferred embodiment. In FIG. 1, first to eighth layers are viewed from the surface of a multilayer substrate, and a ninth layer is viewed from the undersurface of the multilayer substrate. FIG. 2 is an enlarged plan view of the second layer showing the configuration of lead electrodes for a switch IC (SWIC) in a high-frequency module according to the first preferred embodiment.

A high-frequency module according to the first preferred embodiment preferably includes a switch IC (SWIC) and a substantially rectangular multilayer substrate on which the switch IC (SWIC) is mounted. As illustrated in FIG. 1, the multilayer substrate is obtained by laminating nine dielectric layers. A predetermined electrode pattern is provided n the surface or undersurface of each of the layers. A via hole VH represented by a small circle is provided in each of the layers, and functions as a conduction pattern between the layers. In FIGS. 1 and 2, only an electrode pattern and the via hole VH which are required to describe features of a preferred embodiment of the present invention are illustrated, and the illustration of a circuit pattern and a mounting component other than the switch IC in a high-frequency module is omitted.

First, in order to describe the arrangement of lands and a line pattern, a formation pattern of terminal electrodes (bumps) of a switch IC to be mounted will be described. The switch IC (SWIC) is preferably substantially rectangular in plan view and has a predetermined thickness. On a mounting surface of the switch IC (SWIC), a plurality of terminal electrodes to be described later are arranged. Only terminal electrodes of the switch IC (SWIC) that are required to describe features of a preferred embodiment of the present invention will be described.

More specifically, preferably seven RF terminal electrodes, for example, (corresponding to "a plurality of predetermined terminal electrodes" according to a preferred embodiment of the present invention) are arranged in line along a side W1 of the switch IC. Preferably, four driving signal terminal electrodes, for example, are arranged in line along a side W2 opposite to the side W1. Near a side W4 perpendicular or substantially perpendicular to the sides W1 and W2, an antenna terminal electrode is provided. The number of RF terminal electrodes and the number of driving signal terminal electrodes may be changed in accordance with the specifications of the high-frequency module.

The first layer (assigned "1" in FIG. 1) of the multilayer substrate is a surface layer. On the surface of the first layer, various components including the switch IC (SWIC) are mounted. Accordingly, at the first layer, lands including RF terminal lands 101 to 107, driving signal input lands 121 to 124, and an antenna connection land 111 are provided.

More specifically, the RF terminal lands 101 to 107 are preferably individually arranged at locations at which the RF terminal electrodes of the switch IC (SWIC) are disposed so that the RF terminal lands 101 to 107 are arranged in line at the same or substantially the same intervals as those at which the RF terminal electrodes are arranged. The driving signal input lands 121 to 124 are preferably individually arranged at locations at which the driving signal terminal electrodes of the switch IC (SWIC) are disposed so that the driving signal input lands 121 to 124 are arranged in line at the same or substantially the same intervals as those at which the driving signal terminal electrodes are arranged. The antenna connection land 111 is preferably arranged at a location at which the antenna terminal electrode of the switch IC (SWIC) is disposed.

The via holes VH are preferably individually provided at locations at which the RF terminal lands 101 to 107, the driving signal input lands 121 to 124, and the antenna connection land 111 are disposed. Each of the RF terminal lands 101 to 107, the driving signal input lands 121 to 124, and the antenna connection land 111 is electrically connected to a predetermined electrode pattern at the second layer.

At the second layer (assigned "2" in FIG. 1) of the multilayer substrate, RF lead electrodes 201 to 207, driving signal lead electrodes 221 to 224, and an antenna connection lead electrode 211 are provided.

One end of the RF lead electrode 201 is electrically connected to the RF terminal land 101 via the via hole VH. A portion of the RF lead electrode 201 at a predetermined distance from one end thereof preferably extends in a direction away from a switch IC mounting region, that is, a direction substantially perpendicular to the side W1 of the switch IC and an axis on which the RF terminal lands 101 to 107 are arranged. A remaining portion of the RF lead electrode 201 preferably extends from a location spaced apart from one end of the RF lead electrode 201 by the predetermined distance in the direction away from the switch IC mounting region while bending at a right angle two times, for example. However, the remaining portion of the RF lead electrode 201 may not bend when a predetermined positional relationship between the RF lead electrode 201 and a mounting land at the lowermost layer of the multilayer substrate is satisfied.

One end of the RF lead electrode 202 is electrically connected to the RF terminal land 102 via the via hole VH. The RF lead electrode 202 preferably extends from one end thereof in a direction opposite to the direction in which the RF lead electrode 201 extends. That is, the RF lead electrode 202 preferably extends in an opposite direction to the RF lead electrode 201 with respect to the axis on which the RF terminal lands 101 to 107 are arranged.

By using the above-described configuration, even if the RF lead electrodes 201 and 202, which are connected to adjacent RF terminal lands 101 and 102, respectively, are arranged at the same or substantially the same interval as that at which the RF terminal lands 101 and 102 are arranged, the RF lead electrodes 201 and 202 are not arranged close to each other and the isolation between the RF lead electrodes 201 and 202 is improved.

The length of the RF lead electrode 202 is preferably much less than that of the RF lead electrode 201. This prevents the RF lead electrode 202 from being close to a driving signal land and a driving signal lead electrode that are present in a direction toward which the RF lead electrode 202 extends from one end thereof. Therefore, the degradation in isolation between the RF lead electrode 202 and each of the driving signal land and the driving signal lead electrode is prevented.

One end of the RF lead electrode 203 is preferably electrically connected to the RF terminal land 103 via the via hole VH. Similar to the RF lead electrode 201, the RF lead electrode 203 extends from one end thereof in the direction away from the switch IC mounting region, that is, a direction substantially perpendicular to the side W1 of the switch IC and the axis on which the RF terminal lands 101 to 107 are arranged.

By using the above-described configuration, the RF lead electrodes 202 and 203 that are connected to adjacent lands are not arranged close to each other and the isolation between the RF lead electrodes 202 and 203 is improved.

Figure 8:
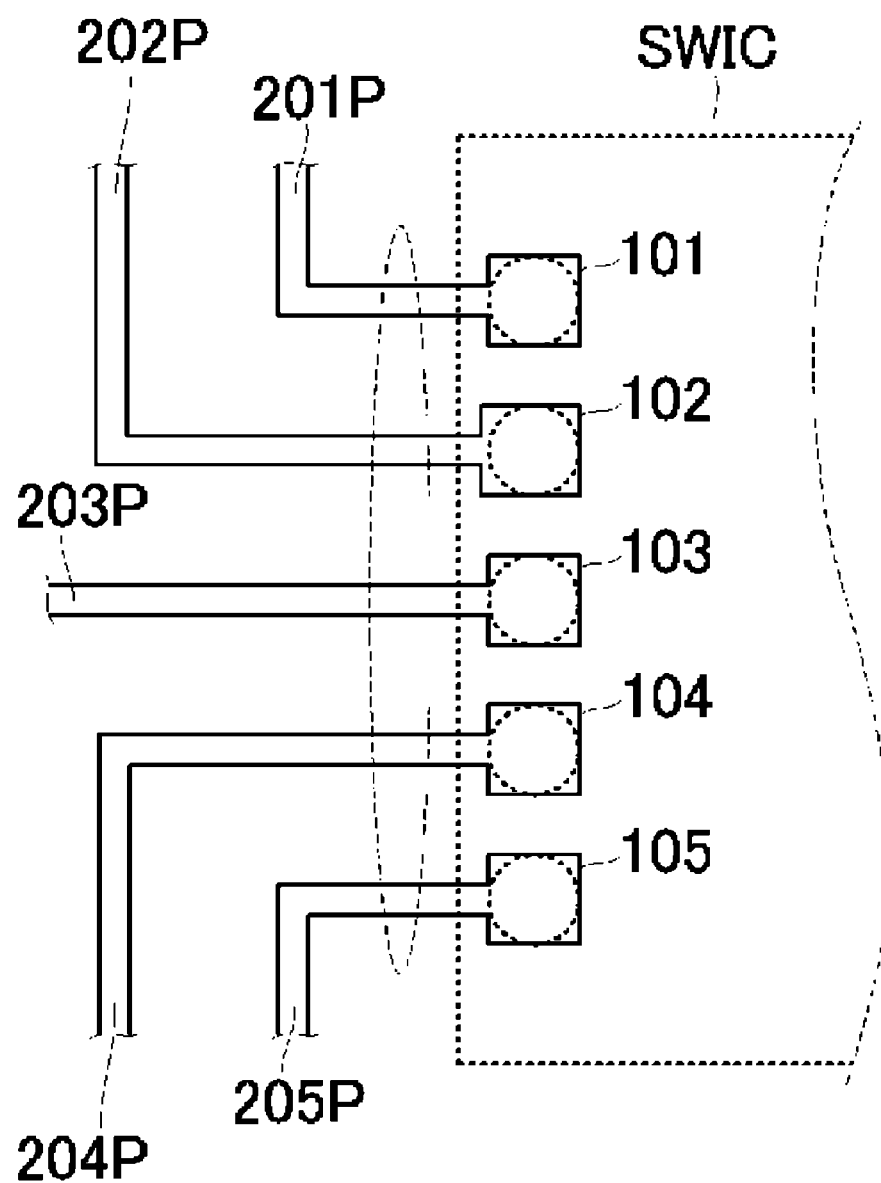
FIG. 8 is an enlarged plan view describing the configuration of lead electrodes in the related art.

The RF lead electrodes 203 and 201 preferably extend in the same or substantially the same direction, and are preferably parallel or substantially parallel to each other. However, as illustrated in FIG. 2, the RF lead electrodes 203 and 201 are spaced at an interval PB that is equivalent or substantially equivalent to a result of the addition of two land intervals PBp. Accordingly, as compared to a case in which a configuration in the related art illustrated in FIG. 8 is used, an interval at which parallel or substantially parallel lead electrodes are spaced can be increased by approximately two times and the isolation between the lead electrodes is further improved.

One end of the RF lead electrode 204 is preferably electrically connected to the RF terminal land 104 via the via hole VH. The RF lead electrode 204 preferably extends from one end thereof in the direction opposite to the direction in which the RF lead electrodes 201 and 203 extend. That is, the RF lead electrode 204 preferably extends in the opposite direction to the RF lead electrodes 201 and 203 with respect to the axis on which the RF terminal lands 101 to 107 are arranged.

By using the above-described configuration, the RF lead electrodes 203 and 204 that are connected to adjacent lands are not arranged close to each other and the isolation between the RF lead electrodes 203 and 204 is improved.

The RF lead electrodes 204 and 202 preferably extend in the same or substantially the same direction, and are preferably parallel or substantially parallel to each other. However, as illustrated in FIG. 2, the RF lead electrodes 204 and 202 are spaced at the interval PB equivalent to a result of the addition of two land intervals PBp. Accordingly, similar to the isolation between the RF lead electrodes 201 and 203, improved isolation between the RF lead electrodes 204 and 202 is achieved.

One end of the RF lead electrode 205 is preferably electrically connected to the RF terminal land 105 via the via hole VH. Similar to the RF lead electrodes 201 and 203, the RF lead electrode 205 preferably extends from one end thereof in the direction away from the switch IC mounting region, that is, the direction substantially perpendicular to the side W1 of the switch IC and the axis on which the RF terminal lands 101 to 107 are arranged.

By using the above-described configuration, the RF lead electrodes 204 and 205 that are connected to adjacent lands are not close to each other and the isolation between the RF lead electrodes 204 and 205 can be enhanced.

The RF lead electrodes 205 and 203 extend in the same direction, and are parallel to each other. However, as illustrated in FIG. 2, the RF lead electrodes 205 and 203 are spaced at the interval PB equivalent to a result of addition of two land intervals PBp. Accordingly, like the isolation between the RF lead electrodes 201 and 203, the enhanced isolation between the RF lead electrodes 205 and 203 can be achieved.

One end of the RF lead electrode 206 is electrically connected to the RF terminal land 106 via the via hole VH. The RF lead electrode 206 extends from one end thereof in the direction opposite to the direction in which the RF lead electrodes 201, 203, and 205 extend. That is, the RF lead electrode 206 extends in the direction exactly opposite to the RF lead electrodes 201, 203, and 205 with respect to the axis on which the RF terminal lands 101 to 107 are arranged.

By using the above-described configuration, the RF lead electrodes 205 and 206 that are connected to adjacent lands are not arranged close to each other and the isolation between the RF lead electrodes 205 and 206 is improved.

The RF lead electrodes 206 and 204 preferably extend in the same or substantially the same direction, and are preferably parallel or substantially parallel to each other. However, as illustrated in FIG. 2, the RF lead electrodes 206 and 204 are spaced at the interval PB equivalent to a result of the addition of two land intervals PBp. Accordingly, similar to the isolation between the RF lead electrodes 202 and 204, the improved isolation between the RF lead electrodes 206 and 204 can be achieved.

One end of the RF lead electrode 207 is electrically connected to the RF terminal land 107 via the via hole VH. Similar to the RF lead electrodes 201, 203, and 205, a portion of the RF lead electrode 207 extends from one end thereof in the direction away from the switch IC mounting region, that is, the direction perpendicular or substantially perpendicular to the side W1 of the switch IC and the axis on which the RF terminal lands 101 to 107 are arranged.

By using the above-described configuration, the RF lead electrodes 206 and 207 that are connected to adjacent lands are not arranged close to each other and the isolation between the RF lead electrodes 206 and 207 is improved.

The RF lead electrodes 207 and 205 preferably extend in the same or substantially the same direction, and are preferably parallel or substantially parallel to each other. However, as illustrated in FIG. 2, the RF lead electrodes 207 and 205 are spaced at the interval PB equivalent to a result of the addition of two land intervals PBp. Accordingly, similar to the isolation between the RF lead electrodes 201 and 203, the improved isolation between the RF lead electrodes 207 and 205 is achieved.

The other ends of the RF lead electrodes 201 to 207 are preferably electrically connected to electrode patterns provided at layers below the second layer via the via holes VH.

One end of each of the driving signal lead electrodes 221 to 224 provided at the second layer is preferably electrically connected to the driving signal lands 121 to 124 provided at the first layer. Each of the driving signal lead electrodes 221 to 224 extends from one end thereof in a direction opposite to the RF lands and a group of the RF lead electrodes.

By using the above-described configuration, the driving signal lead electrodes 221 to 224 are not arranged close to the RF lands and the group of the RF lead electrodes. As a result, the isolation between an RF transmission path and a driving signal transmission path is further improved.

One end of the antenna connection lead electrode 211 provided at the second layer is preferably electrically connected to the antenna connection land 111 provided at the first layer via the via hole VH. The antenna connection lead electrode 211 preferably extends from one end thereof in the direction away from the RF lands and the group of the RF lead electrodes.

By using the above-described configuration, the antenna connection lead electrode 211 is not arranged close to the RF lands and the group of the RF lead electrodes. As a result, the isolation between an RF transmission path and a transmission path for antenna connection is improved.

The other ends of the antenna connection lead electrode 211 and the driving signal lead electrodes 221 to 224 are preferably electrically connected to electrode patterns provided at layers below the second layer via the via holes VH.

At the third layer (assigned "3" in FIG. 1), the fourth layer (assigned "4" in FIG. 1), and the fifth layer (assigned "5" in FIG. 1) of the multilayer substrate, a group of via holes arranged to connect the RF lead electrodes 201 to 207, the antenna connection lead electrode 211, and the driving signal lead electrodes 221 to 224 to layers below the fifth layer is provided.

A ground electrode 401G is preferably disposed on substantially the entire surface of the fourth layer (assigned "4" in FIG. 1) in plan view except for regions having a predetermined area in which via holes are individually provided.

At the sixth layer (assigned "6" in FIG. 1) of the multilayer substrate, an intermediate lead electrode 602 including one end connected to the RF lead electrode 202 via via holes at the second to fifth layers is provided. In addition, at the sixth layer, an intermediate lead electrode 604 including one end connected to the RF lead electrode 204 and an intermediate lead electrode 606 including one end is connected to the RF lead electrode 206 are provided. Portions of the intermediate lead electrode 602, 604, and 606 at a predetermined distance from one end thereof preferably extend in different directions, so that the isolation among these intermediate lead electrodes is improved. A portion of the intermediate lead electrode 604 and a portion of the intermediate lead electrode 606 are preferably arranged parallel or substantially parallel to each other. However, when a predetermined positional relationship between each of the intermediate lead electrodes 604 and 606 and a mounting land at the lowermost layer of the multilayer substrate in the lamination direction is satisfied, the distance between the intermediate lead electrodes 604 and 606 may be increased or the intermediate lead electrodes 604 and 606 may not be arranged to be partially parallel or substantially parallel to each other. In this case, the isolation between the intermediate lead electrodes 604 and 606 is further improved.

Since the fourth layer at which the ground electrode 401G is provided is disposed between the sixth layer at which the intermediate lead electrodes 602, 604, and 606 are provided and the second layer at which the RF lead electrodes 201, 203, 205, and 207 are provided, the coupling between the intermediate lead electrode and the RF lead electrode in the lamination direction is effectively prevented.

At the seventh layer (assigned "7" in FIG. 1) and the eighth layer (assigned "8" in FIG. 1) of the multilayer substrate, a group of via holes is preferably provided to connect each of the RF lead electrodes 201, 203, 205, and 207, the intermediate lead electrodes 602, 604, and 606, the antenna connection lead electrode 211, and the driving signal lead electrodes 221 to 224 to corresponding one of RF mounting lands 901 to 907, an antenna mounting land 911, and driving signal mounting lands 921 to 924 at the ninth layer.

In addition, a ground electrode 801G is preferably provided on substantially the entire surface of the eighth layer (assigned "8" in FIG. 1) in plan view except for regions having a predetermined area in which via holes excluding via holes connected to a ground connection land 900G provided at the ninth layer are individually provided.

At the ninth layer (assigned "9" in FIG. 1) of the multilayer substrate, mounting lands are preferably provided. More specifically, the RF mounting lands 903 to 906 are preferably arranged along a first side PW1 on the side of the RF terminal electrodes of the switch IC, the driving signal mounting lands 921 to 924 are preferably arranged along a second side PW2 opposite to the first side PW1, the RF mounting land 907 is preferably provided on the side of the first side PW1 along a third side PW3 perpendicular or substantially perpendicular to the first side PW1, the RF mounting lands 901 and 902 are preferably provided on the side of the first side PW1 along a fourth side PW4 opposite to the third side PW3, and the antenna mounting land 911 is preferably provided on the side of the second side PW2 along the fourth side PW4.

Each of the RF mounting lands 901 to 907 is preferably connected to a corresponding one of the RF terminal lands 101 to 107 at which RF terminal electrodes of the switch IC are individually disposed via corresponding one of the lead electrodes 201 to 207, corresponding one of the intermediate lead electrodes 602, 604, and 606, and a corresponding via hole. Each of the driving signal mounting lands 921 to 924 is preferably connected to a corresponding one of the driving signal input lands 121 to 124 at which the driving signal terminal electrodes of the switch IC are individually disposed via a corresponding one of the driving signal lead electrodes 221 to 224 and a corresponding via hole at each layer. The antenna mounting land 911 is preferably connected to the antenna connection land 111 at which the antenna terminal electrode of the switch IC is disposed via the antenna connection lead electrode 211 and a corresponding via hole at each layer.

Thus, a high-frequency module including a switch IC is achieved. By using the above-described configuration, the isolation between RF lead electrodes in a multilayer substrate is effectively improved. As a result, it is possible to prevent a signal from entering a nontarget terminal electrode of a switch IC via a lead electrode. It is therefore possible to suppress the occurrence of defects in the switching characteristics and the transmission characteristics of a switch IC, for example, a switching operation malfunction and the entrance of noise.

Figure 3:
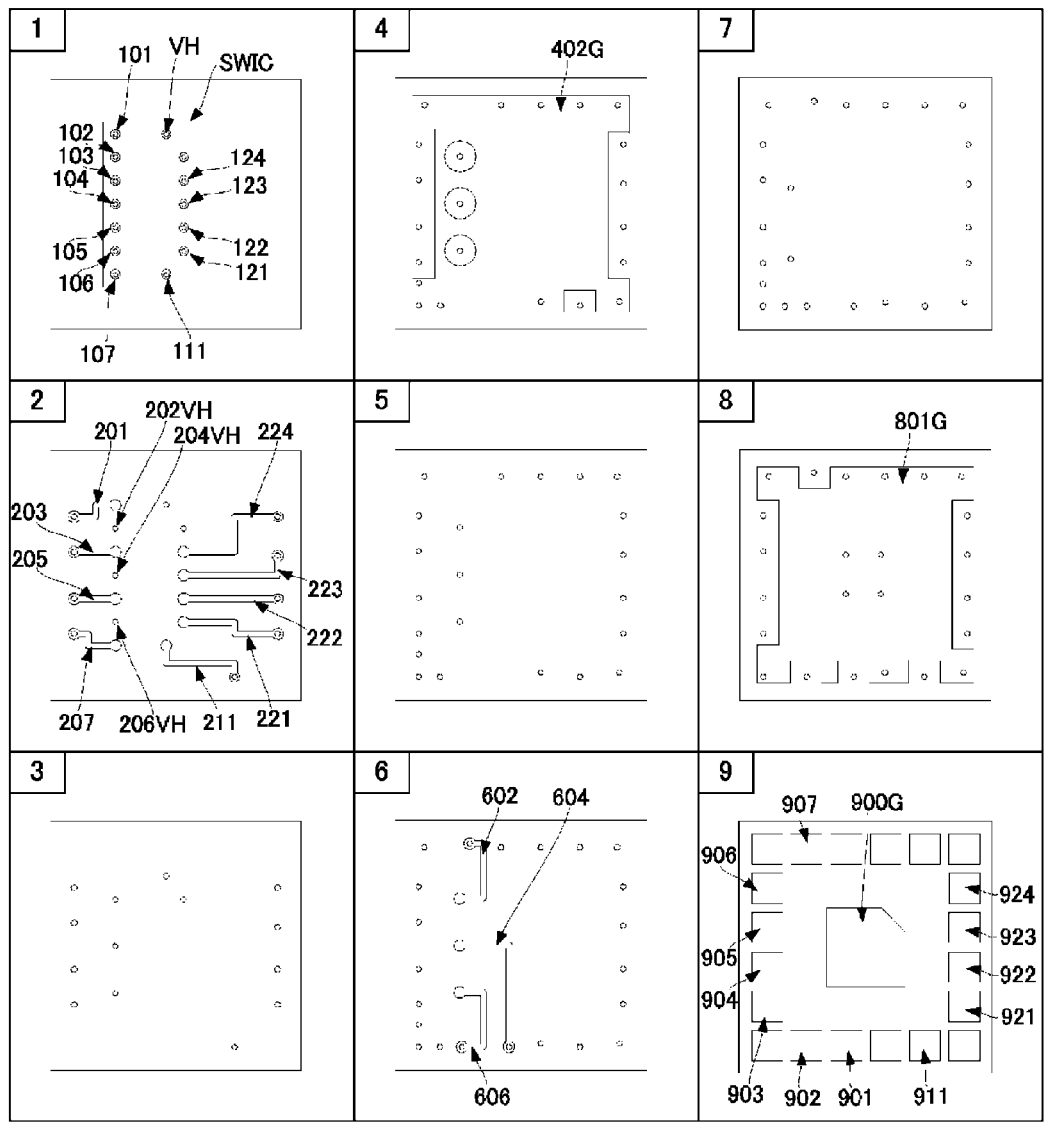
FIG. 3 is a lamination diagram of a high-frequency module according to a second preferred embodiment of the present invention.

Next, a high-frequency module according to a second preferred embodiment of the present invention will be described with reference to the accompanying drawing. FIG. 3 is a lamination diagram of a high-frequency module according to the second preferred embodiment.

The difference between a high-frequency module according to the second preferred embodiment and a high-frequency module according to the first preferred embodiment illustrated in FIG. 1 is only that line patterns connected to the RF terminal lands 102, 104, and 106 are different from those described in the first preferred embodiment. Accordingly, only line patterns connected to the RF terminal lands 102, 104, and 106 will be described.

At a second layer (assigned "2" in FIG. 3) of a multilayer substrate in a high-frequency module according to the second preferred embodiment, the RF lead electrodes 202, 204, and 206 are not provided. The RF terminal land 102 provided at a first layer is preferably connected to the intermediate lead electrode 602 provided at a sixth layer via a via hole 202VH provided at the second layer and via holes connected to the via hole 202VH provided at the third to fifth layers. The RF terminal land 104 provided at the first layer is preferably connected to the intermediate lead electrode 604 provided at the sixth layer via a via hole 204VH provided at the second layer and via holes connected to the via hole 204VH provided at the third to fifth layers. The RF terminal land 106 provided at the first layer is preferably connected to the intermediate lead electrode 606 provided at the sixth layer via a via hole 206VH provided at the second layer and via holes connected to the via hole 206VH formed at the third to fifth layers.

Even if the above-described configuration is used, similar to the first preferred embodiment, the isolation between RF terminal electrodes of a switch IC is further improved as compared to a case in which a configuration in the related art is used.

Figure 4:
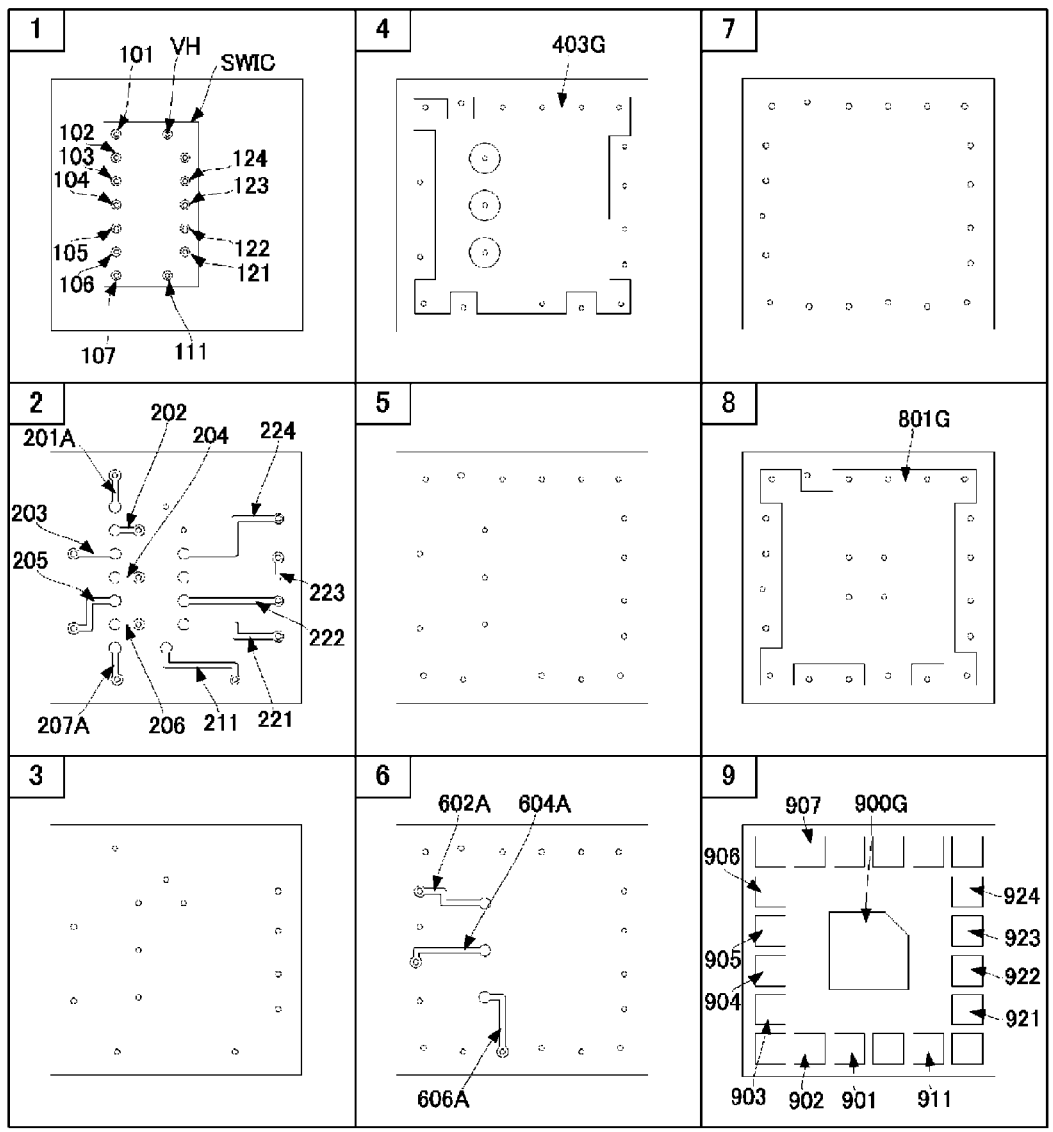
FIG. 4 is a lamination diagram of a high-frequency module according to a third preferred embodiment of the present invention.

Next, a high-frequency module according to a third preferred embodiment of the present invention will be described with reference to the accompanying drawing. FIG. 4 is a lamination diagram of a high-frequency module according to the third preferred embodiment.

The difference between a high-frequency module according to the third preferred embodiment and a high-frequency module according to the first preferred embodiment illustrated in FIG. 1 is only that line patterns connected to the RF terminal lands 101 and 107 are different from those described in the first preferred embodiment. Accordingly, only the line patterns connected to the RF terminal lands 101 and 107 will be described.

In a high-frequency module according to the third preferred embodiment, RF lead electrodes 201A and 207A at a second layer (assigned "2" in FIG. 4) of a multilayer substrate preferably extend in directions parallel or substantially parallel to a direction in which lands are arranged. The RF lead electrode 201A including one end connected to the RF terminal land 101 at an end near the side W3 of the switch IC preferably extends from one end thereof in a direction away from the group of the lands, that is, to the side W3. The RF lead electrode 207A including one end connected to the RF terminal land 107 at an end near the side W4 of the switch IC preferably extends from one end thereof in a direction away from the group of the lands, that is, to the side W4. That is, the RF lead electrodes 201A and 207A preferably extend in directions that are perpendicular or substantially perpendicular to directions in which the RF lead electrodes 202 to 206 extend and in opposite directions to each other.

By using the above-described configuration, there is no electrode pattern parallel or substantially parallel to each of the RF lead electrodes 201A and 207A at both ends. Accordingly, the isolation of each of the RF lead electrodes 201A and 207A from another lead electrode is improved.

By arranging the RF lead electrodes 201A and 207A along the direction in which the lands are arranged, the space between the RF lead electrodes 203 and 205 is increased. As illustrated in FIG. 4, at the second layer, the RF lead electrode 205 is preferably bent so as to increase the distance between the RF lead electrodes 203 and 205. As a result, the isolation between the RF lead electrodes 203 and 205 is further improved.

Thus, according to the third preferred embodiment, as compared to a case in which a configuration according to the first preferred embodiment is used, the isolation between RF terminal electrodes of a switch IC is further improved.

Figure 5:
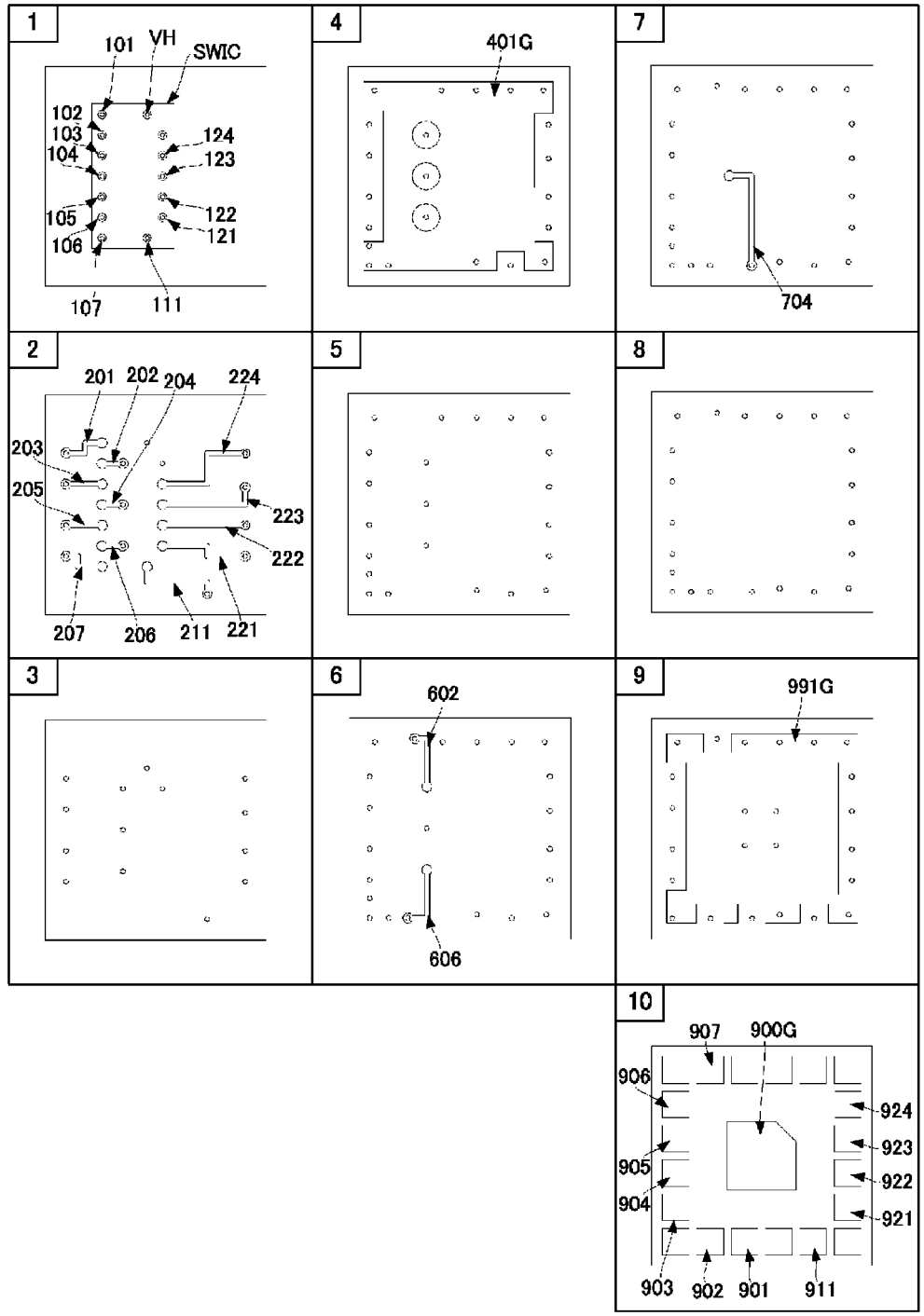
FIG. 5 is a lamination diagram of a high-frequency module according to a fourth preferred embodiment of the present invention.

Next, a high-frequency module according to a fourth preferred embodiment of the present invention will be described with reference to the accompanying drawing. FIG. 5 is a lamination diagram of a high-frequency module according to the fourth preferred embodiment.

The difference between a high-frequency module according to the fourth preferred embodiment and a high-frequency module according to the first preferred embodiment illustrated in FIG. 1 is only that a formation pattern of intermediate lead electrodes is different from that described in the first preferred embodiment. Accordingly, only the intermediate lead electrodes will be described.

The configurations of first to fifth layers of a multilayer substrate according to the fourth preferred embodiment are the same or substantially the same as those of the first to fifth layers of a multilayer substrate according to the first preferred embodiment, respectively.

At a sixth layer (assigned "6" in FIG. 5) of a multilayer substrate according to the fourth preferred embodiment, the intermediate lead electrodes 602 and 606 are preferably provided. The shapes of the intermediate lead electrodes 602 and 606 are the same or substantially the same as those of the intermediate lead electrodes 602 and 606 at the six layer described in the first preferred embodiment, respectively.

At a seventh layer (assigned "7" in FIG. 5) of the multilayer substrate, an intermediate lead electrode 704 is preferably provided. The shape of the intermediate lead electrode 704 is the same or substantially the same as that of the intermediate lead electrode 604 at the sixth layer described in the first preferred embodiment.

The configurations of eighth to tenth layers of the multilayer substrate are the same or substantially the same as those of the seventh to ninth layers of a multilayer substrate according to the first preferred embodiment, respectively.

By using the above-described configuration, since the intermediate lead electrodes 704 and 606, which include portions that are arranged parallel or substantially parallel to each other in plan view, are preferably provided at different layers, the isolation between the intermediate lead electrodes 704 and 606 is improved. As compared to a case in which a configuration according to the first preferred embodiment is used, the isolation between RF terminal electrodes of a switch IC is further improved.

Next, a high-frequency module according to a fifth preferred embodiment of the present invention will be described with reference to the accompanying drawing. FIG. 6 is a lamination diagram of a high-frequency module according to the fifth preferred embodiment.

The difference between a high-frequency module according to the fifth preferred embodiment and a high-frequency module according to the first preferred embodiment illustrated in FIG. 1 is only that a line pattern connected to the RF terminal land 103 is different from that described in the first preferred embodiment. Accordingly, only the line pattern connected to the RF terminal land 103 will be described.

At a second layer (assigned "2" in FIG. 6) of a multilayer substrate according to the fifth preferred embodiment, the RF lead electrode 203 is not provided. The RF terminal land 103 at a first layer is preferably connected to an intermediate lead electrode 703 at a seventh layer via a via hole 203VH at the second layer and via holes at third to sixth layers which are connected to the via hole 203VH.

By using the above-described configuration, even if the RF lead electrode 201 connected to the RF terminal land 101 and the intermediate lead electrode 703 connected to the RF lead electrode 203 are parallel or substantially parallel to each other, the enhanced isolation between the RF lead electrode 201 and the intermediate lead electrode 703 is achieved because the RF lead electrode 201 and the intermediate lead electrode 703 are provided at different layers via five layers one of which includes a ground electrode 404G. Accordingly, as compared to a case in which a configuration according to the first preferred embodiment is used, the isolation between RF terminal electrodes of a switch IC is further improved.

Figure 7A:
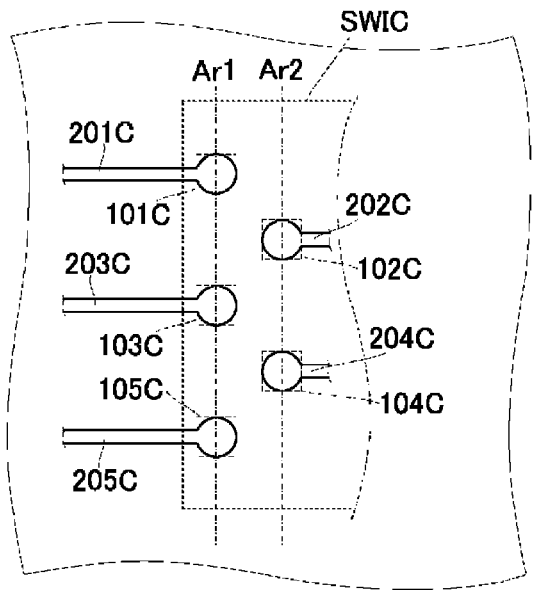
FIGS. 7A and 7B are enlarged plan views describing the configuration of lead electrodes for a switch IC whose RF terminal electrodes are arranged in a staggered pattern.
Figure 7B:
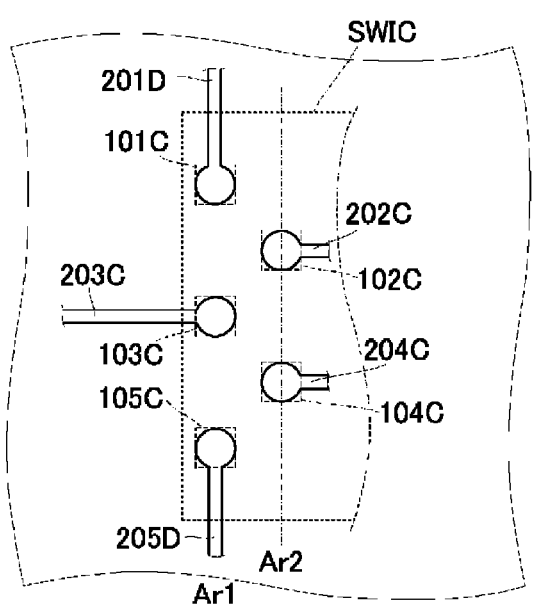

In the above-described preferred embodiments, in a switch IC, a plurality of RF terminal electrodes are preferably arranged in a line. However, as illustrated in FIGS. 7A and 7B, in a switch IC, a plurality of RF terminal electrodes may preferably be arranged along two parallel or substantially parallel axes in a staggered pattern. The above-described lead electrode pattern may be used for such a switch IC. FIG. 7A is an enlarged plan view showing the configuration of lead electrodes arranged in directions perpendicular or substantially perpendicular to a land arrangement direction when a switch IC whose RF terminal electrodes are arranged in a staggered pattern is used. FIG. 7B is an enlarged plan view describing the configuration of lead electrodes including lead electrodes at both ends arranged along the land arrangement direction when a switch IC whose RF terminal electrodes are arranged in a staggered pattern is used.

When the RF terminal electrodes of a switch IC are arranged in a staggered pattern, as illustrated in FIGS. 7A and 7B, RF terminal lands 101C, 103C, and 105C are disposed on a first axis Ar1 and RF terminal lands 102C and 104C are disposed on a second axis Ar2 parallel or substantially parallel to the first axis Ar1. The RF terminal land 102C on the second axis Ar2 is preferably disposed midway between the RF terminal lands 101C and 103C along the land arrangement direction. The RF terminal land 104C on the second axis Ar2 is similarly preferably disposed midway between the RF terminal lands 103C and 105C along the land arrangement direction.

As illustrated in FIG. 7A, the RF lead electrodes 201C, 203C, and 205C preferably extend from one end that are connected to the RF terminal land 101C, 103C, and 105C, respectively, in a direction opposite to the second axis Ar2. The RF lead electrodes 202C and 204C preferably extend from one end that are connected to the RF terminal land 102C and 104C, respectively, in a direction opposite to the first axis Ar1.

By using the above-described configuration, similar to the first preferred embodiment, the isolation between RF lead electrodes is improved. Since the staggered arrangement of RF terminal electrodes of a switch IC is used, the extension starting position of each of the RF lead electrodes 201C, 203C, and 205C and the extension starting position of each of the RF lead electrodes 202C and 204C are spaced apart from each other in accordance with the distance between the first axis Ar1 and the second axis Ar2. It is therefore possible to further improve the isolation between RF terminal electrodes of a switch IC.

As illustrated in FIG. 7B, each of RF lead electrodes 201D and 205D at both ends is preferably arranged along the first axis Ar1, that is, an axis on which RF terminal lands are arranged, and preferably extends from one end thereof connected to a corresponding land in a direction away from a group of the lands. As a result, similar to in the third preferred embodiment, the isolation between RF terminal electrodes of a switch IC is further improved.

Although not described in detail in the above-described preferred embodiments of the present invention0, when frequency bands of signals transmitted by RF circuits partially overlap, the above-described operation and the above-described effect is particularly efficient. In particular, when frequency bands of signals transmitted by adjacent RF terminal electrodes and adjacent RF lead electrodes partially overlap, the above-described operation and the above-described effect is even more efficient.

In the above-described preferred embodiments of the present invention, a high-frequency module including a switch IC has been described. However, a high-frequency module including a circuit element arranged to receive/output the same types of RF signals, instead of a switch IC, may include the above-described configuration.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency module comprising:
a switch IC; and
a multilayer substrate on which the switch IC is mounted; wherein
the switch IC includes a plurality of connection terminals arranged in a predetermined direction;
the multilayer substrate includes a plurality of lands and a plurality of lead electrodes, the plurality of lands being arranged in a land arrangement direction on a mounting surface for the switch IC so as to be connected to the plurality of predetermined connection terminals, each of the plurality of lead electrodes extending from a respective one of the plurality of lands;
each of the plurality of lead electrodes extends in a direction opposite to a direction in which an adjacent lead electrode of the plurality of lead electrodes extends;
the plurality of lands are alternately arranged on a first axis and a second axis along the land arrangement direction in a staggered pattern;
the plurality of lands are arranged under the switch IC;
the first axis is arranged along an outer edge of the switch IC and the second axis is arranged inwardly from the outer edge of the switch IC;
first lead electrodes of the plurality of lead electrodes are connected to first adjacent lands of the plurality of lands, which are arranged along the first axis in the land arrangement direction, the first lead electrodes extending from the first adjacent lands in a direction opposite to the second axis;
second lead electrodes of the plurality of lead electrodes are connected to second adjacent lands of the plurality of lands, which are arranged along on the second axis in the land arrangement direction, the second lead electrodes extending from the second adjacent lands in a direction opposite to the first axis;
the plurality of connection terminals of the switch IC are alternately arranged on the first axis and the second axis on which the plurality of lands are arranged so as to overlap one another in a plan view;
the first adjacent lands do not overlap the second adjacent lands in the plan view;
the multilayer substrate includes a plurality of layers;
the first lead electrodes and the second lead electrodes are disposed on different ones of the plurality of layers of the multilayer substrate; and
additional lead electrodes of the plurality of lead electrodes are arranged on at least one interior layer of the plurality of layers of the multilayer substrate.

2. The high-frequency module according to claim 1, wherein frequency bands of signals transmitted to adjacent lands of the plurality of lands and adjacent lead electrodes of the plurality of lead electrodes partially overlap each other.

3. The high-frequency module according to claim 1, wherein
the switch IC includes a plurality of driving signal input terminals defined by RF terminals arranged to transmit/receive a high-frequency signal; and
the multilayer substrate includes a plurality of driving signal lands that are connected to the plurality of driving signal input terminals and a plurality of driving signal lead electrodes that extend from the plurality of driving signal lands in a direction away from the plurality of predetermined terminal electrodes that are RF terminals.

* * * * *